(12) United States Patent
Chueh

(10) Patent No.: US 10,097,154 B2
(45) Date of Patent: Oct. 9, 2018

(54) POWER DIVIDING CIRCUIT AND POWER DIVIDER

(71) Applicant: NANNING FUGUI PRECISION INDUSTRIAL CO., LTD., Nanning (CN)

(72) Inventor: Yu-Chih Chueh, New Taipei (TW)

(73) Assignee: NANNING FUGUI PRECISION INDUSTRIAL CO., LTD., Nanning (CN)

( * ) Notice: Subject to any disclaimer, the term of this patent is extended or adjusted under 35 U.S.C. 154(b) by 0 days.

(21) Appl. No.: 15/235,225

(22) Filed: Aug. 12, 2016

(65) Prior Publication Data

US 2017/0338793 A1  Nov. 23, 2017

(30) Foreign Application Priority Data

May 20, 2016  (TW) .............................. 105115890 A

(51) Int. Cl.
*H01P 5/12* (2006.01)
*H03H 7/46* (2006.01)
*H03H 7/01* (2006.01)
*H03H 7/38* (2006.01)
*H03H 7/48* (2006.01)

(52) U.S. Cl.
CPC ................ *H03H 7/46* (2013.01); *H01P 5/12* (2013.01); *H03H 7/1758* (2013.01); *H03H 7/1791* (2013.01); *H03H 7/38* (2013.01); *H03H 7/48* (2013.01)

(58) Field of Classification Search
CPC ........... H03H 7/46; H03H 7/1783; H03H 7/38
See application file for complete search history.

(56) References Cited

U.S. PATENT DOCUMENTS 6,748,207 B1 * 6/2004 Tochigi ..................... H01P 5/16
455/327

FOREIGN PATENT DOCUMENTS

CN  102881981 A  1/2013

* cited by examiner

*Primary Examiner* — Robert J Pascal
*Assistant Examiner* — Kimberly Glenn
(74) *Attorney, Agent, or Firm* — ScienBiziP, P.C.

(57) ABSTRACT

A power dividing circuit includes a first transmission sub-circuit having an input port and a first resonant circuit, a second transmission sub-circuit having a second resonant circuit, and a third transmission sub-circuit having a third resonant circuit. A matching element is coupled between the second transmission sub-circuit and the third transmission sub-circuit. An input carrier signal is divided into a first signal to the second transmission sub-circuit and a second signal to the third transmission sub-circuit through the first transmission sub-circuit. The second resonant circuit and the third resonant circuit generate resonant frequency to reduce high frequency harmonics under a specific frequency range in the input carrier signal. A power divider is also provided.

16 Claims, 3 Drawing Sheets

POWER DIVIDING CIRCUIT AND POWER DIVIDER

FIELD

The subject matter herein generally relates to a power dividing circuits and a power divider.

BACKGROUND

A power divider is a basic component in a system processing microwaves to perform signals separation and used in almost all antenna arrays and balanced circuits. A filter is used to perform signals filtering.

BRIEF DESCRIPTION OF THE DRAWINGS

Implementations of the present technology will now be described, by way of example only, with reference to the attached figures.

DETAILED DESCRIPTION

Figure 1:
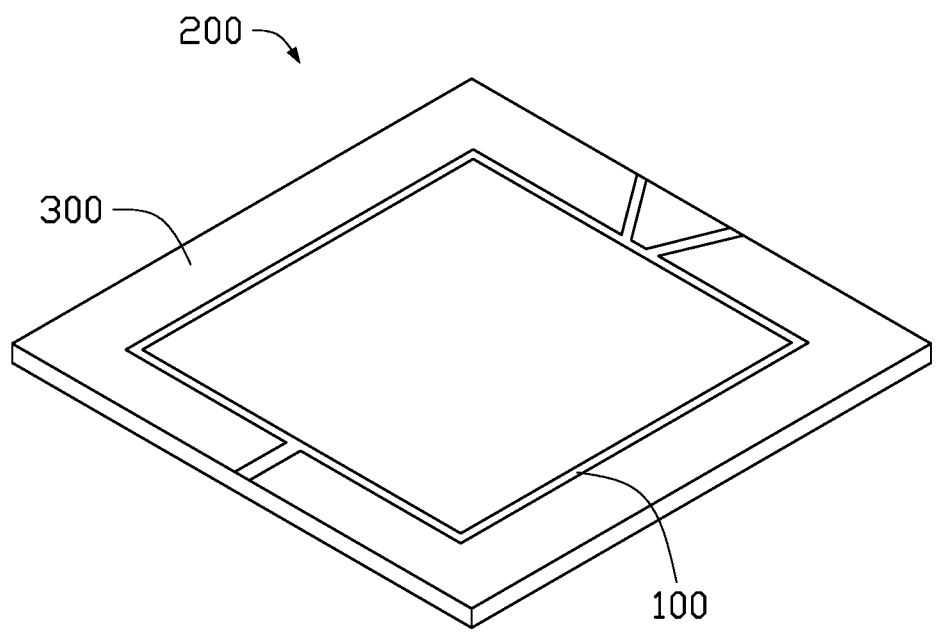
FIG. 1 is a structural diagram of an exemplary embodiment of a power divider of the present disclosure.

It will be appreciated that for simplicity and clarity of illustration, where appropriate, reference numerals have been repeated among the different figures to indicate corresponding or analogous elements. In addition, numerous specific details are set forth in order to provide a thorough understanding of the exemplary embodiments described herein. However, it will be understood by those of ordinary skill in the art that the exemplary embodiments described herein can be practiced without these specific details. In other instances, methods, procedures, and components have not been described in detail so as not to obscure the related relevant feature being described. Also, the description is not to be considered as limiting the scope of the exemplary embodiments described herein. The drawings are not necessarily to scale and the proportions of certain parts may be exaggerated to better illustrate details and features of the present disclosure.

Several definitions that apply throughout this disclosure will now be presented.

The term "coupled" is defined as connected, whether directly or indirectly through intervening components, and is not necessarily limited to physical connections. The connection can be such that the objects are permanently coupled or releasably coupled. The term "comprising," when utilized, means "including, but not necessarily limited to"; it specifically indicates open-ended inclusion or membership in the so-described combination, group, series, and the like.

The disclosure describes a power divider.

FIG. 1 illustrates an exemplary embodiment of a power divider 200.

The power divider 200 comprises a power dividing circuit 100 and a basal board 300. The power dividing circuit 100 is installed on an upper surface of the basal board 300. A grounded board (not shown) is attached to a lower surface of the basal board 300.

Figure 2:
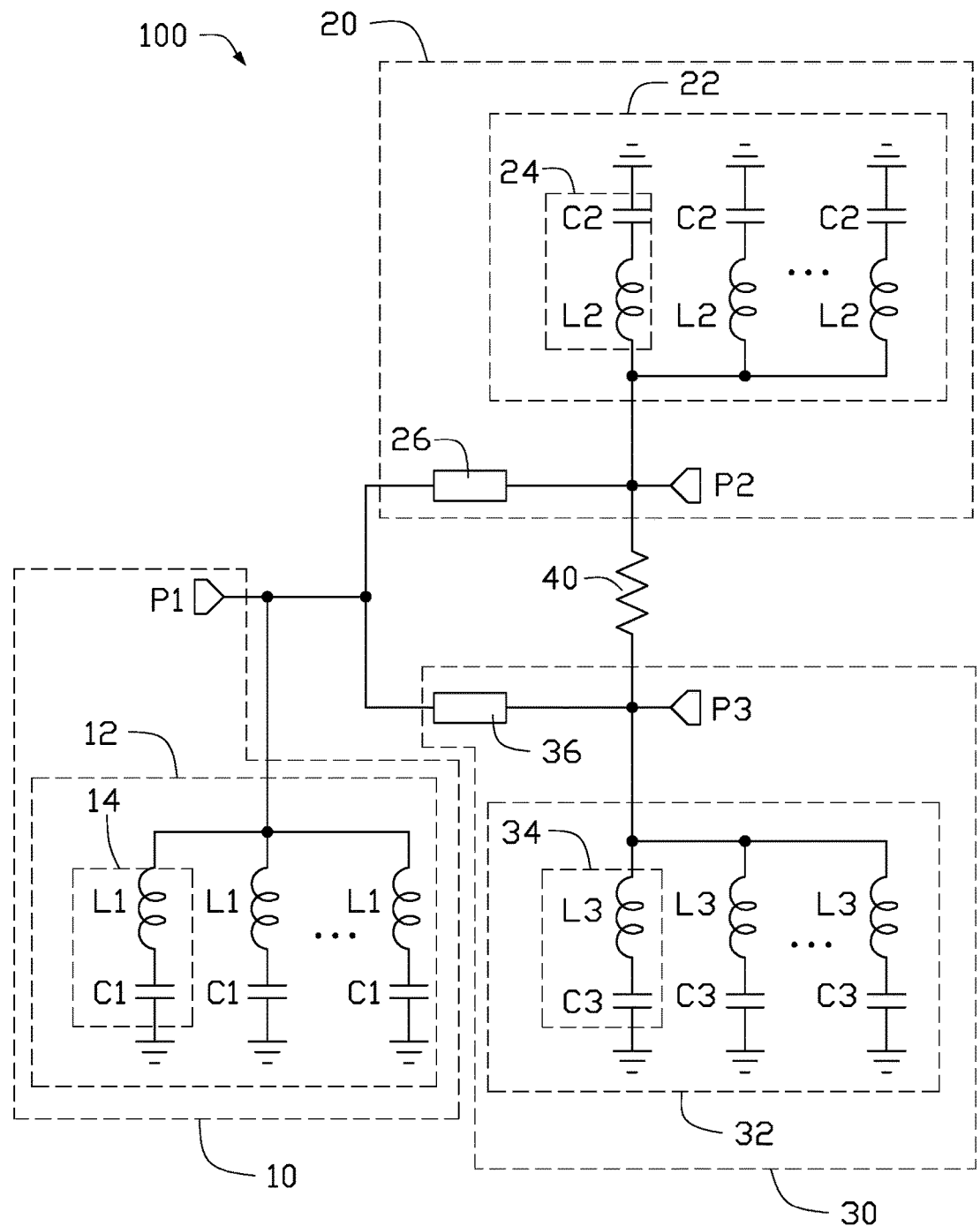
FIG. 2 is a circuit diagram of an exemplary embodiment of a power dividing circuit of the present disclosure.

FIG. 2 illustrates an exemplary embodiment of the power dividing circuit 100.

The power dividing circuit 100 can comprise a first transmission sub-circuit 10, a second transmission sub-circuit 20, and a third transmission sub-circuit 30.

The first transmission sub-circuit 10 can comprise a first resonant circuit 12 and an input port P1. The first resonant circuit 12 is coupled between the input port P1 and ground.

The first resonant circuit 12 can comprise a plurality of resonators 14 coupled in parallel.

Each resonator 14 can comprise a capacitor C1 and a inductor L1 coupled to the capacitor C1 in series.

The second transmission sub-circuit 20 can comprise a second resonant circuit 22, a microstrip line 26, and a first output port P2. The second resonant circuit 22 is coupled between the first output port P2 and ground. The second resonant circuit 22 is further coupled to the input port P1 through the microstrip line 26.

The second resonant circuit 22 can comprise a plurality of resonators 24 coupled in parallel. The plurality of resonators 24 is configured to generate a resonance frequency to filter carrier signals inputted from the input port P1. The number of the resonators 14 is equal to that of the resonators 24.

A circuit structure of the second transmission sub-circuit 20 is the same as that of the third transmission sub-circuit 30. The second transmission sub-circuit 20 and the third transmission sub-circuit 30 are symmetrically arranged on the top surface of the basal board 300.

Each resonator 24 can comprise a capacitor C2 and an inductor L2 coupled to the capacitor C2 in series.

The third transmission sub-circuit 30 can comprise a third resonant circuit 32, a microstrip line 36, and a second output port P3. The third resonant circuit 32 is coupled between the second output port P3 and ground. The third resonant circuit 32 is further coupled to the input port P1 through the microstrip line 36.

The third resonant circuit 32 can comprise a plurality of resonators 34 coupled in parallel. The plurality of resonators 34 is configured to generate a resonance frequency to filter carrier signals inputted from the input port P1. The number of the resonators 34 is equal to that of the resonators 24.

Each resonator 34 can comprise a capacitor C3 and an inductor L3 coupled to the capacitor C3 in series.

A matching element 40 is coupled between the first output port P2 and the second output port P3. A matching element 40 first terminal is coupled between the first output port P2 and the microstrip 26, and a matching element 40 second terminal is coupled between the second output port P3 and the microstrip 36. The matching element 40 is configured to match impedance between the second transmission sub-circuit 20 and the third transmission sub-circuit 30.

In one exemplary embodiment, the matching element 40 is further configured to isolate a connection between the second transmission sub-circuit 20 and the third transmission sub-circuit 30.

In at least one exemplary embodiment, the matching element 40 is a resistor with a resistance of 100 Ohms.

In this exemplary embodiment, each of the second resonant circuit 22 and the third resonant circuit 32 comprises two resonators. A length of the basal board 300 can be 8.78 millimeter, a width of the basal board 300 can be 4.66 millimeter, a thickness of the basal board 300 can be 0.4 millimeter, a permittivity of the basal board 300 can be 4, and a loss tangent of the basal board 300 can be 0.022.

Figure 3:
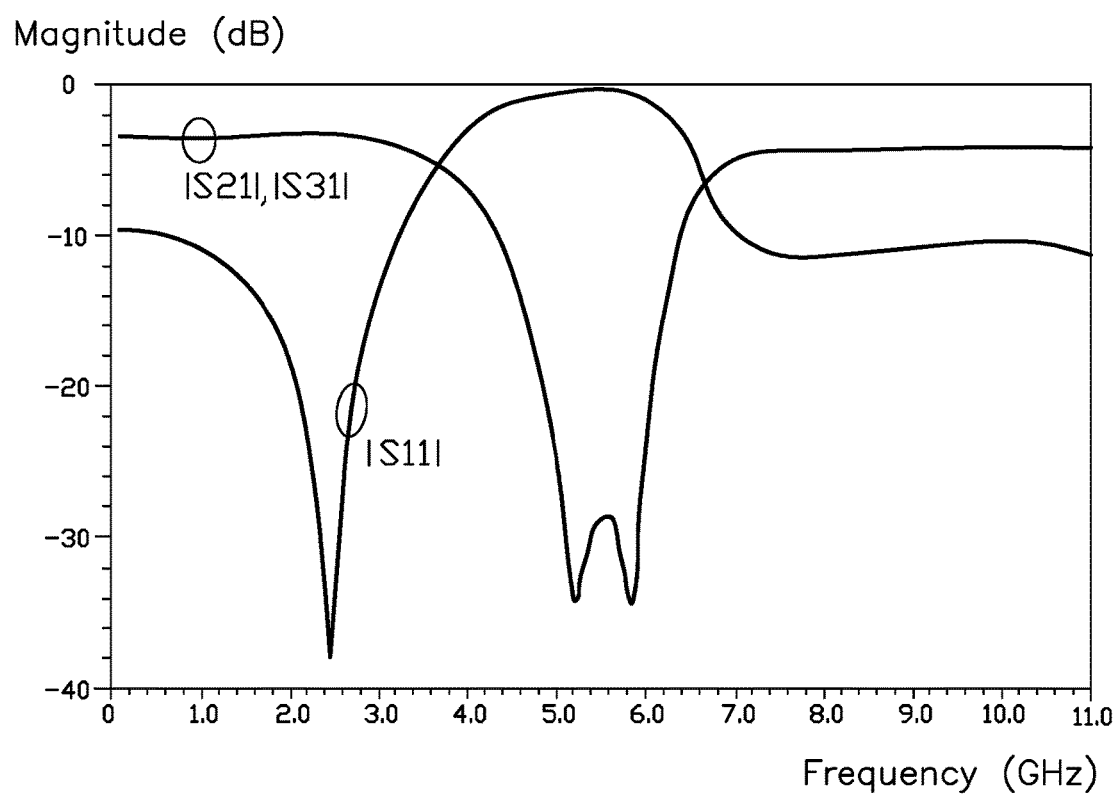
FIG. 3 is a diagram showing a simulation of an exemplary embodiment of the power divider of FIG. 1 of the present disclosure.

FIG. 3 illustrates a performance simulation of the power divider 200. In this exemplary embodiment, an operation frequency of the power divider 200 is 2.45 gigahertz (GHz). The X axis shows frequency and the Y axis shows transmission characteristics, S11 shows a return loss of the power divider 200, S21 shows an insertion loss from the first output port P2 to the input port P1, and S31 shows an insertion loss from the second output port P3 to the input port P1. In the simulation, the curve S21 overlaps with the curve S31 and the resonant frequencies of the second resonant circuit 22 and the third resonant circuit 32 are 5.2 GHz and 5.8 GHz, respectively. High frequency harmonics with a frequency range between 4.8 to 6.1 can be prevented, and the power divider 200 has good reducing effect on high frequency harmonics. Each of the insertion loss S21 and the insertion loss S31 is less than −20 dB.

Thus, when an input carrier signal is inputted to the input port P1, the input carrier signal is divided into a first signal and a second signal through the second transmission sub-circuit 20 and the third transmission sub-circuit 30. The first signal is transmitted to the first output port P2 through the second resonant circuit 22, and the second signal is transmitted to the second output port P3 through the third resonant circuit 32. Thereby, the power dividing circuit is able to perform a power dividing function.

In other exemplary embodiment, three or more resonators are coupled in series between the input port P1 and the first output port P2 to generate three or more difference resonance frequency signals to reduce high frequency harmonics. Three or more resonators are coupled in series between the input port P1 and the second output port P3 to generate three or more difference resonance frequency signals to reduce high frequency harmonics.

In one exemplary embodiment, the power divider 200 can comprise two or more power dividing circuits 100 to improve filtering performance of the power divider 200.

While the disclosure has been described by way of example and in terms of the exemplary embodiment, it is to be understood that the disclosure is not limited thereto. On the contrary, it is intended to cover various modifications and similar arrangements as would be apparent to those skilled in the art. Therefore, the range of the appended claims should be accorded the broadest interpretation so as to encompass all such modifications and similar arrangements.

What is claimed is:

1. A power dividing circuit, comprising:
   a first transmission sub-circuit having an input port and a first resonant circuit;
   a second transmission sub-circuit having a second resonant circuit, a first microstrip line, and a first output port;
   a third transmission sub-circuit having a third resonant circuit, a second microstrip line, and a second output port; and
   a matching element with a matching element first terminal electrically coupled between the first microstrip line and the first output port and a matching second terminal electrically coupled between the second microstrip line and the second output port;
   wherein the first resonant circuit is electrically coupled between the input port and ground, the second resonant circuit is electrically coupled between the first output port and ground, the second resonant circuit is electrically coupled to the input port through the first microstrip line, the third resonant circuit is electrically coupled between the second output port and ground, and the third resonant circuit is electrically coupled to the input port through the second microstrip line; wherein the first resonant circuit comprises a plurality of first resonators coupled in parallel, and each first resonator comprises a first capacitor and a first inductor electrically coupled in series.

2. The power dividing circuit of claim 1, wherein the second resonant circuit comprises a plurality of second resonators electrically coupled in parallel, and each second resonator comprises a second capacitor and a second inductor electrically coupled in series.

3. The power dividing circuit of claim 2, wherein the third resonant circuit comprises a plurality of third resonators electrically coupled in parallel, and each third resonator comprises a third capacitor and a third inductor electrically coupled in series.

4. The power dividing circuit of claim 1, wherein the matching element is a resistor.

5. The power dividing circuit of claim 1, wherein the matching element is configured to match impedance between the second transmission sub-circuit and the third transmission sub-circuit, and the matching element is further configured to isolate a connection between the second transmission sub-circuit and the third transmission sub-circuit.

6. The power dividing circuit of claim 1, further comprising a basal board, wherein the second transmission sub-circuit and the third transmission sub-circuit are symmetrically arranged on a top surface of the basal board.

7. A power dividing circuit, comprising:
   a first transmission sub-circuit having an input port and a first resonant circuit;
   a second transmission sub-circuit having a second resonant circuit, a first microstrip line, and a first output port;
   a third transmission sub-circuit having a third resonant circuit, a second microstrip line, and a second output port; and
   a matching element with a matching element first terminal electrically coupled between the first microstrip line and the first output port and a matching second terminal coupled electrically between the second microstrip line and the second output port;
   wherein the first resonant circuit is electrically coupled between the input port and ground, the second resonant circuit is electrically coupled between the first output port and ground, and the second resonant circuit is further electrically coupled to the input port through the first microstrip line; and the third resonant circuit is coupled between the second output port and ground, and the third resonant circuit is further electrically coupled to the input port through the second microstrip line; and
   wherein each of the first resonant circuit, the second resonant circuit, and the third resonant circuit comprises a plurality of resonators electrically coupled in parallel, and each resonator comprises a capacitor and an inductor electrically coupled in series.

8. The power dividing circuit of claim 7, wherein the matching element is a resistor.

9. The power dividing circuit of claim 7, further comprising a basal board, wherein the second transmission sub-circuit and the third transmission sub-circuit are symmetrically arranged on a top surface of the basal board.

10. The power dividing circuit of claim 7, wherein the matching element is configured to match impedance between the second transmission sub-circuit and the third transmission sub-circuit, and the matching element is further configured to isolate a connection between the second transmission sub-circuit and the third transmission sub-circuit.

11. A power divider, comprising:

a basal board;

a grounded board, the grounded board attached to a lower surface of the basal board; and a power dividing circuit, the power dividing circuit installed on an upper surface of the basal board, the power dividing circuit comprising:

a first transmission sub-circuit having an input port and a first resonant circuit;

a second transmission sub-circuit having a second resonant circuit, a first microstrip line, and a first output port;

a third transmission sub-circuit having a third resonant circuit, a second microstrip line, and a second output port; and a matching element with a matching element first terminal electrically coupled between the first microstrip line and the first output port and a matching second terminal electrically coupled between the second microstrip line and the second output port;

wherein the first resonant circuit is electrically coupled between the input port and ground, the second resonant circuit is electrically coupled between the first output port and ground, and the second resonant circuit is further electrically coupled to the input port through the first microstrip line; and the third resonant circuit is electrically coupled between the second output port and ground, and the third resonant circuit is further electrically coupled to the input port through the second microstrip line, wherein the first resonant circuit comprises a plurality of first resonators electrically coupled in parallel, and each first resonator comprises a first capacitor and a first inductor electrically coupled in series.

12. The power divider of claim 11, wherein the second resonant circuit comprises a plurality of second resonators electrically coupled in parallel, and each second resonator comprises a second capacitor and a second inductor electrically coupled in series.

13. The power divider of claim 12, wherein the third resonant circuit comprises a plurality of third resonators electrically coupled in parallel, and each third resonator comprises a third capacitor and a third inductor electrically coupled in series.

14. The power divider of claim 11, wherein the matching element is a resistor.

15. The power divider of claim 11, wherein the second transmission sub-circuit and the third transmission sub-circuit are symmetrically arranged on the upper surface of the basal board.

16. The power divider of claim 11, wherein a length of the basal board is 8.78 millimeters, a width of the basal board is 4.66 millimeters, a thickness of the basal board is millimeters, a permittivity of the basal board is 4, and a loss tangent of the basal board is 0.022.

* * * * *